(12) United States Patent
Yu

(10) Patent No.: US 7,696,765 B2
(45) Date of Patent: Apr. 13, 2010

(54) SYSTEM AND METHOD FOR MEASURING A CABLE RESISTANCE IN A POWER OVER ETHERNET APPLICATION

(75) Inventor: James Yu, San Jose, CA (US)

(73) Assignee: Broadcom Corporation, Irvine, CA (US)

(*) Notice: Subject to any disclaimer, the term of this patent is extended or adjusted under 35 U.S.C. 154(b) by 197 days.

(21) Appl. No.: 11/849,336

(22) Filed: Sep. 3, 2007

(65) Prior Publication Data

US 2009/0058436 A1    Mar. 5, 2009

(51) Int. Cl.
G01R 27/02 (2006.01)
G06F 1/26 (2006.01)

(52) U.S. Cl. .................... 324/722; 324/713; 713/300

(58) Field of Classification Search ............... 324/713, 324/722
See application file for complete search history.

(56) References Cited

U.S. PATENT DOCUMENTS

2006/0164108 A1* 7/2006 Herbold ............... 324/691
2007/0237322 A1* 10/2007 Hussain et al. ........... 379/413

* cited by examiner

Primary Examiner—Vincent Q Nguyen
(74) Attorney, Agent, or Firm—Duabe S. Kobayashi

(57) ABSTRACT

A system and method for measuring a cable resistance in a power over Ethernet (PoE) application. A short circuit module in a powered device is designed to produce a short circuit effect upon receipt of a cable resistance detection voltage. The cable resistance detection voltage can be designed to be greater than a voltage for detection or classification and less than a voltage for powering of the powered device. The measurement of the current at a time when a short circuit effect is produced at the powered device enables a calculation of the actual resistance of the cable on a given PoE port.

8 Claims, 7 Drawing Sheets

SYSTEM AND METHOD FOR MEASURING A CABLE RESISTANCE IN A POWER OVER ETHERNET APPLICATION

BACKGROUND

1. Field of the Invention

The present invention relates generally to Power over Ethernet (PoE) and, more particularly, to a system and method for measuring a cable resistance in a PoE application.

2. Introduction

The IEEE 802.3af and 802.3at PoE specifications provide a framework for delivery of power from power sourcing equipment (PSE) to a powered device (PD) over Ethernet cabling. In this framework, various PDs can be deployed such as voice over IP (VoIP) phones, wireless LAN access points, network cameras, computing devices, etc.

In the PoE process, a valid device detection is first performed. This detection process identifies whether or not it is connected to a valid device to ensure that power is not applied to non-PoE capable devices. After a valid PD is discovered, the PSE can optionally perform a Layer 1 power classification. For example, in the IEEE 802.3af standard, the classification step identifies a power classification of the PD from the various power classes of 15.4 W, 7.0 W, and 4.0 W. In various PoE implementations, a Layer 2 power classification process can be initiated to reclassify the power class or implement some form of dynamic classification.

After the classification process is complete, the PSE would allocate power to the port. In a typical usage scenario, the PSE has a fixed power budget that can easily be oversubscribed by the connected PDs. Management of such a fixed power budget can therefore dictate that lower priority PDs would not receive a power allocation from the PSE.

In this fixed power budget environment, it is important for the PSE to accurately determine a power budget for the various powered ports. One factor that can impact the power budget for the particular port is the physical characteristics (e.g., resistance) of the cable connecting the PSE and the PD. The more information that is available regarding the physical characteristics of the cable, the greater the accuracy in the power budget assigned to the individual ports. What is needed therefore is a mechanism for accurately identifying the cable characteristics in a PoE application.

SUMMARY

A system and/or method for measuring a cable resistance in a PoE application, substantially as shown in and/or described in connection with at least one of the figures, as set forth more completely in the claims.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

Figure 1:
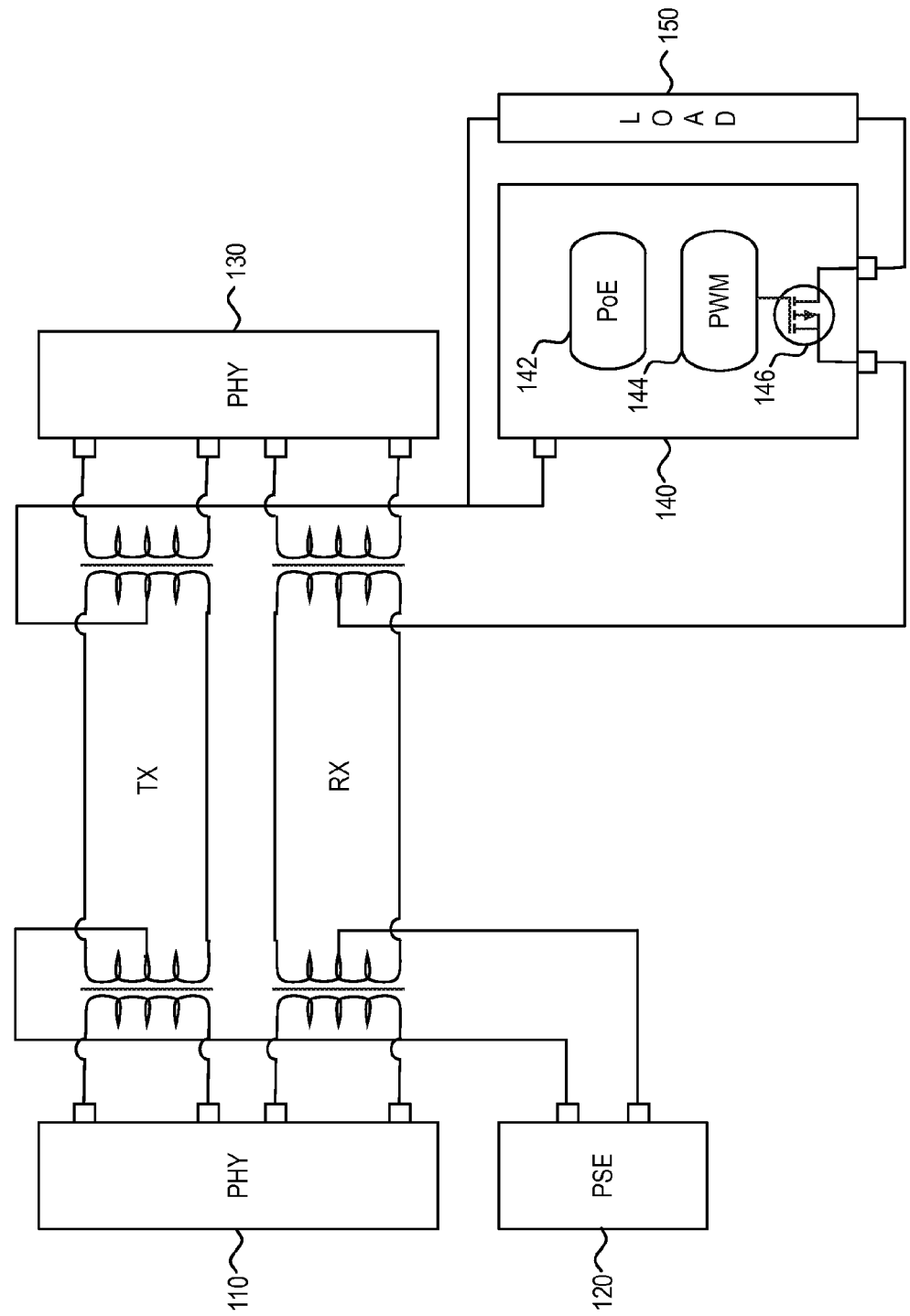
FIG. 1 illustrates an embodiment of a PoE system.

FIG. 1 illustrates an embodiment of a power over Ethernet (PoE) system. As illustrated, the PoE system includes power sourcing equipment (PSE) 120 that transmits power to powered device (PD) 140. Power delivered by the PSE to the PD is provided through the application of a voltage across the center taps of transformers that are coupled to a transmit (TX) pair and a receive (RX) pair of wires carried within an Ethernet cable. In general, the TX/RX pair can be found in, but not limited to structured cabling. The two TX and RX pairs enable data communication between Ethernet PHYs 110 and 130 in accordance with 10BASE-T, 100BASE-TX, 1000BASE-T, 10GBASE-T and/or any other layer 2 PHY technology.

As is further illustrated in FIG. 1, PD 140 includes PoE module 142. PoE module 142 includes the electronics that would enable PD 140 to communicate with PSE 120 in accordance with a PoE standard such as IEEE 802.3af, 802.3at, legacy PoE transmission, or any other type of PoE transmission. PD 140 also includes pulse width modulation (PWM) DC:DC controller 144 that controls power FET 146, which in turn provides constant power to load 150.

In the example of the IEEE 802.3af standard, PSE 120 can deliver up to 15.4 W of power to a plurality of PDs (only one PD is shown in FIG. 1 for simplicity). In the IEEE 802.at specification, on the other hand, a PSE can deliver up to 30 W of power to a PD over 2-pairs or 60 W of power to a PD over 4-pairs. Other proprietary solutions can potentially deliver even higher levels of power to a PD. In general, high power solutions are often limited by the limitations of the cabling.

Figure 2A:
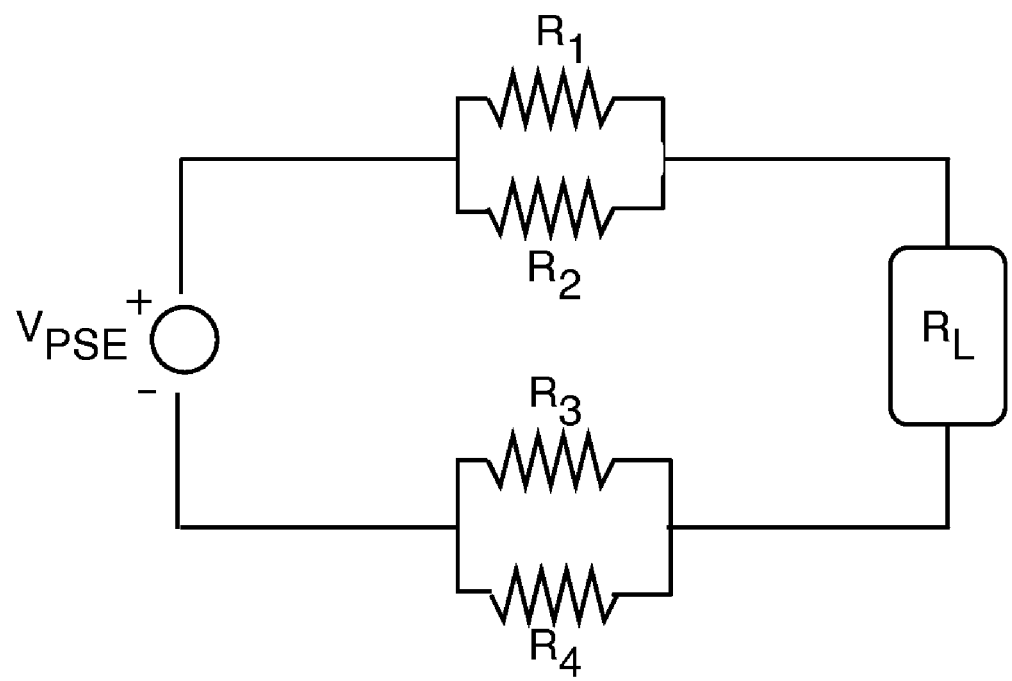
FIGS. 2A and 2B illustrate a circuit model for the powering of a PD.

The delivery of power from PSE 120 to load 150 can be modeled by the circuit model illustrated in FIG. 2A. As illustrated, a power source provides a voltage $V_{PSE}$ to a circuit that includes a first parallel pair of resistors ($R_1$, $R_2$), a load resistance $R_{LOAD}$, and a second parallel pair of resistors ($R_3$, $R_4$). Here, the first parallel pair of resistors $R_1$, $R_2$ represents the resistances of the TX pair of wires, while the second parallel pair of resistors $R_3$, $R_4$ represents the resistances of the RX pair of wires.

The values of resistors $R_1$, $R_2$, $R_3$, and $R_4$ depend on the type and length of Ethernet cable. Specifically, the resistors $R_1$, $R_2$, $R_3$, and $R_4$ have a certain resistance/length that is dependent on a type of Ethernet cable (e.g., Category 3, 5, 6, etc.). For example, for Category 3 Ethernet cable, resistors $R_1$, $R_2$, $R_3$, and $R_4$ would have a resistance of approximately 0.2Ω/meter. Thus, for a 100-meter Category 3 Ethernet cable, each of resistors $R_1$, $R_2$, $R_3$, and $R_4$ would have a value of 20Ω. In this example, parallel resistors $R_1$ and $R_2$ would have an equivalent resistance of 10Ω, while parallel resistors $R_3$ and $R_4$ would also have an equivalent resistance of 10Ω. In combination, the total value of the Ethernet cable resistance ($R_{cable}$) can then be determined as the sum of 10Ω+ 10Ω=20Ω. A simplified PoE circuit model that includes the single cable resistance value $R_{cable}$ is illustrated in FIG. 2B.

In a typical PoE application, the resistance of the cable is either estimated or assumed to have a worst-case value. For example, an 802.3af PoE application can assume a worst-case resistance of 20Ω, which is the resistance of 100 m of category 3 cable.

Figure 2B:
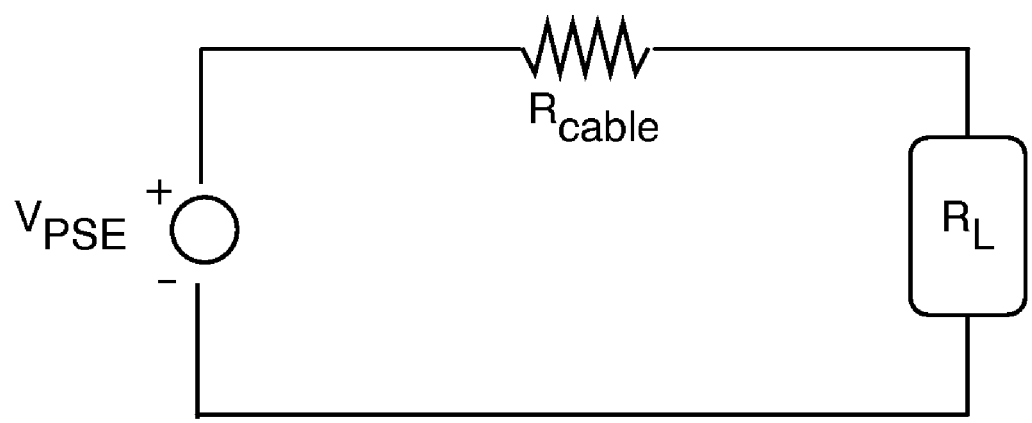

In the circuit model of FIG. 2B, where the PD includes a DC:DC converter, the load resistance $R_L$ would receive constant power, $P_L$, and see a voltage $V_L$ on its input. Since $P_L$ is fixed at the load, $P_L=I*V_L$, where I is the current going through the whole circuit. The power loss of the cable would then be $P_{loss}=I^2*R_{cable}$.

In specifying the minimum output power of 15.4 W for the PSE, the IEEE 802.3af standard assumes that the PD is connected to the PSE using 100 m of Category 3 cable. At a current limit of 350 mA, the worst-case power loss attributed to the cable is $P_{loss}=(350 mA)^2*20Ω=2.45$ W. This worst-case power loss of 2.45 W is the difference between the PSE's minimum output power and the max power drawn by the PD (i.e., 15.4 W-12.95 W=2.45 W). As the amount of power loss attributable to the cable is directly proportional to the resistance of the cable, the accuracy of the cable resistance estimate plays a significant role in the accuracy of the power budget.

In accordance with the present invention, the resistance of the cable is determined through a direct measurement. This is in contrast to conventional techniques that are based on cable resistance estimation or worst-case assumptions.

Figure 3:
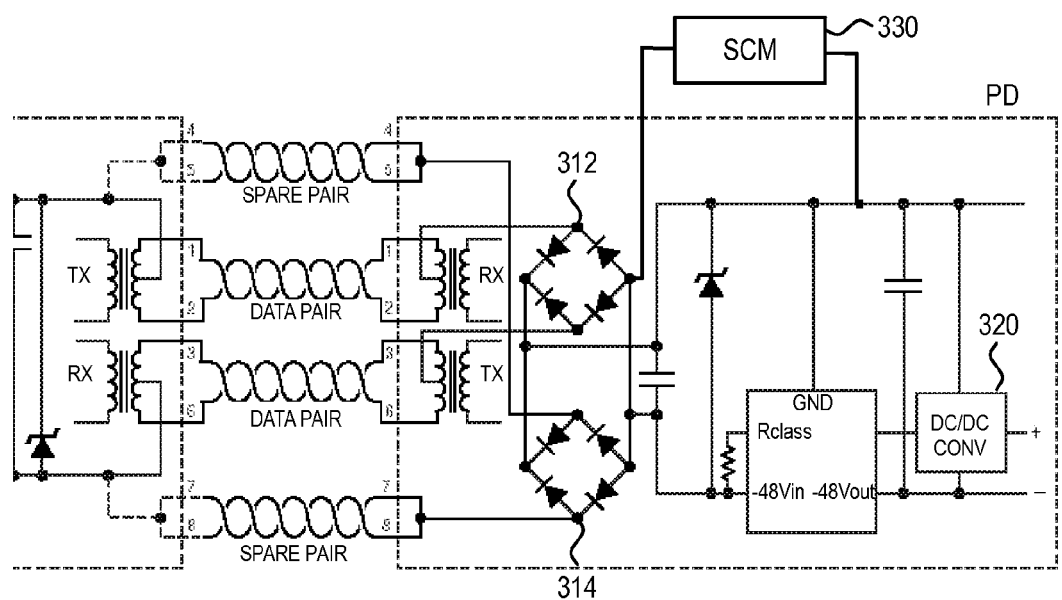
FIG. 3 illustrates an embodiment of a mechanism that enables measurement of a cable resistance.

FIG. 3 illustrates an embodiment of a mechanism by which the resistance of the cable can be measured. As illustrated, the Ethernet cable includes two data wire pairs and two spare wire pairs. The two data wire pairs are used for data transmission (TX) and reception (RX). The PD can receive power that is provided by the data wire pairs and/or the spare wire pairs. Under 802.3af, the two data wire pairs would be used in Alternative A powering, while the two spare wire pairs would be used in Alternative B powering. Power extracted from the two data wire pairs would be routed through diode bridge 312. Power extracted from the two spare wire pairs would be routed through diode bridge 314. DC/DC converter 320 ultimately provides the power to the load in the PD.

In the present invention, the measurement of the cable resistance is enabled through the operation of short circuit module (SCM) 330. In general, SCM 330 is designed to produce a short circuit in the PD at a time when the PSE intends to measure the current and voltage of the circuit. As illustrated in FIG. 2B, a short circuit in the PD would remove the load from the overall circuit. The result is a circuit that includes simply the PSE voltage and the cable resistance. With knowledge of both the voltage and the current through the circuit, the PSE can then calculate the resistance of the cable.

Figure 4:
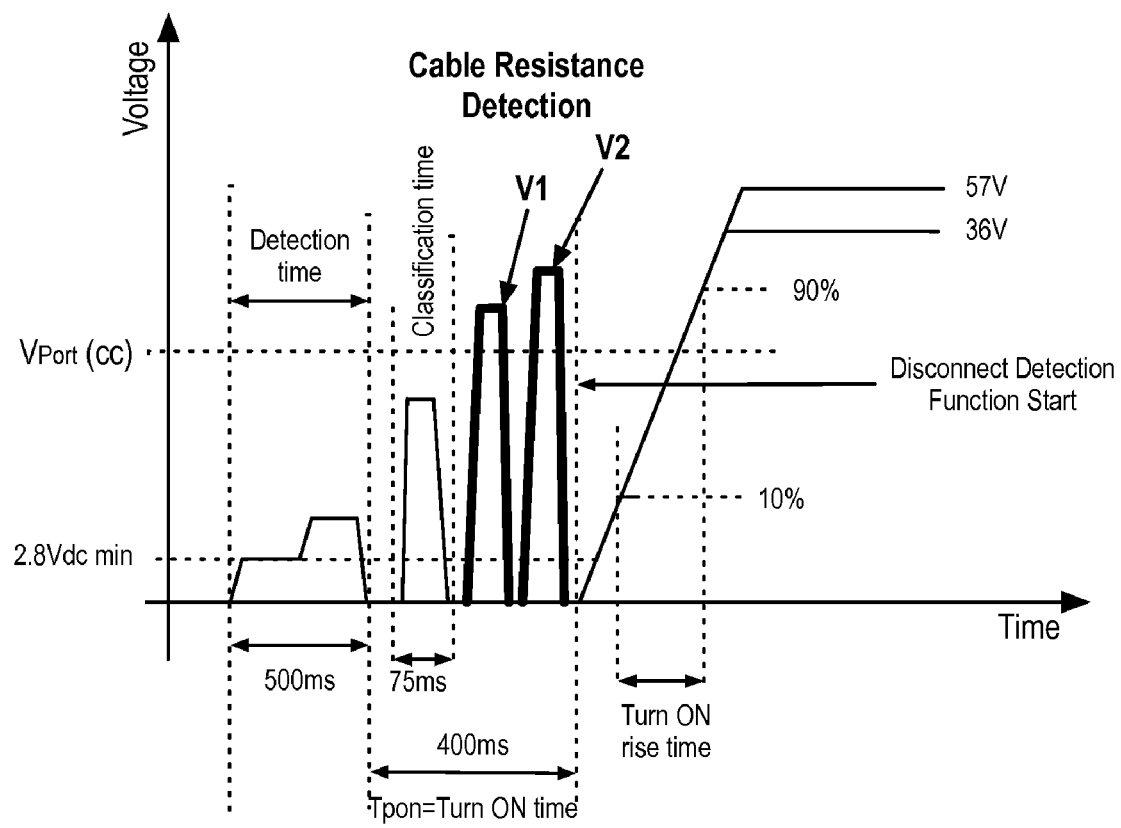
FIG. 4 illustrates an embodiment of a cable resistance detection in a PoE process.

FIG. 4 illustrates an embodiment of a sequence during which SCM 330 produces a short circuit in the PD. In the illustration of FIG. 4, a two-point detection occurs during the 500 ms Detection time. This 500 ms Detection time is followed by a 400 ms Turn On time, the expiration of which would commence powering of the PD. As noted above, an optional classification can also occur after PD detection. This optional classification can occur within the 75 ms Classification time as shown.

In one embodiment, the cable resistance detection is designed to occur in the time slot between the Classification time and the Turn On time. This embodiment is illustrated in the sequence of FIG. 4. In an alternative embodiment, the cable resistance detection can be designed to occur in the time slot between the Detection time and the Classification time. As would be appreciated, the particular point in the PoE sequence during which the cable resistance detection would occur would be implementation dependent.

Figure 5:
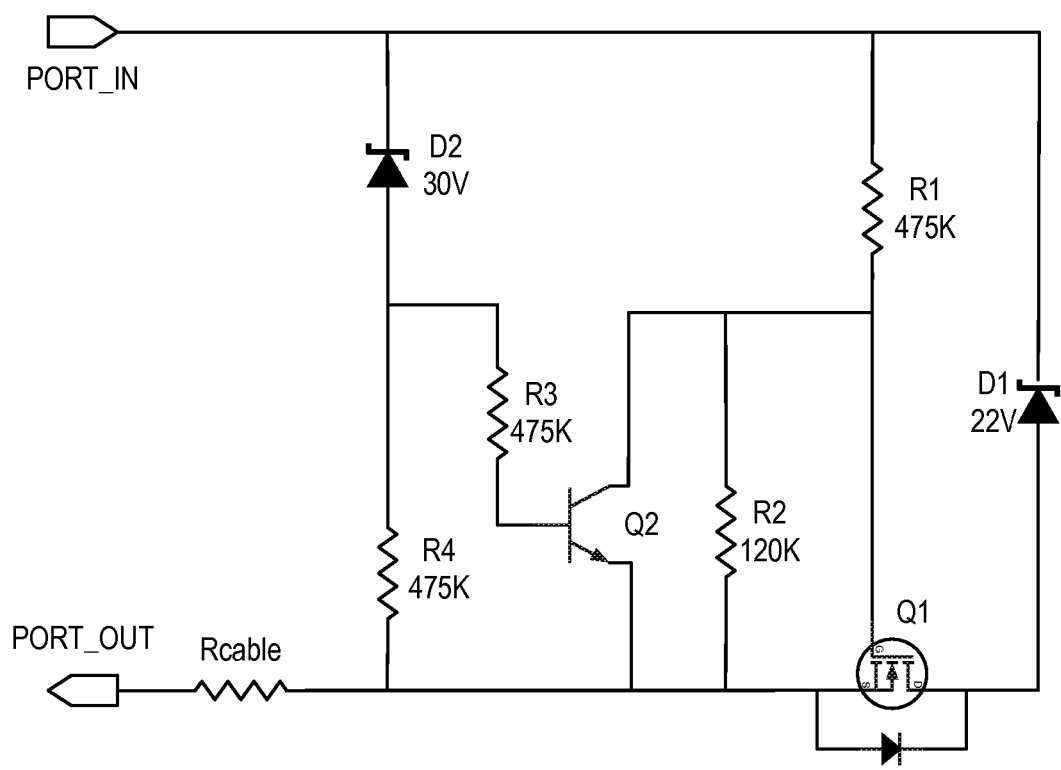
FIG. 5 illustrates an embodiment of a short circuit module.

FIG. 5 illustrates an embodiment of SCM 330. As noted, the circuit of FIG. 5 is coupled on one end to diode bridges 312, 314, and on the other end to the ground of the PD. SCM 330 is placed behind diode bridges 312, 314 because the polarity of the voltage received on the two data wire pairs and/or the two spare wire pairs may not be known. In an alternative embodiment, SCM 330 can be placed in front of diode bridges 312, 314. In this arrangement, SCM 330 can be coupled directly to the two spare wire pairs and/or the taps of the transformers of the two data wire pairs.

To illustrate the operation of the SCM of FIG. 5, reference is made to the PoE process of FIG. 4. As illustrated, the cable resistance detection is based on a two-point detection scheme. In this two-point detection scheme, the PSE generates two voltages V1 and V2 (V2>V1) between 21V to 30V. Here the voltage V1 is chosen to be greater than the voltage used for classification (e.g., 15V-20V), while the voltage V2 is chosen to be less than the voltage used during powering of the PD (e.g., 36V). SCM 330 can therefore be designed to work between 21V to 30V. In operation, SCM 330 is designed to keep the input voltage at a certain stable level (i.e., V1 and V2) for a period of time. During these times, the PSE can then calculate the resistance of the cable precisely by measuring the DC current during the established voltage windows. When the incoming voltage is outside of the window of 21V to 30V, SCM 330 would be an open circuit for the DC voltage.

Figure 6:
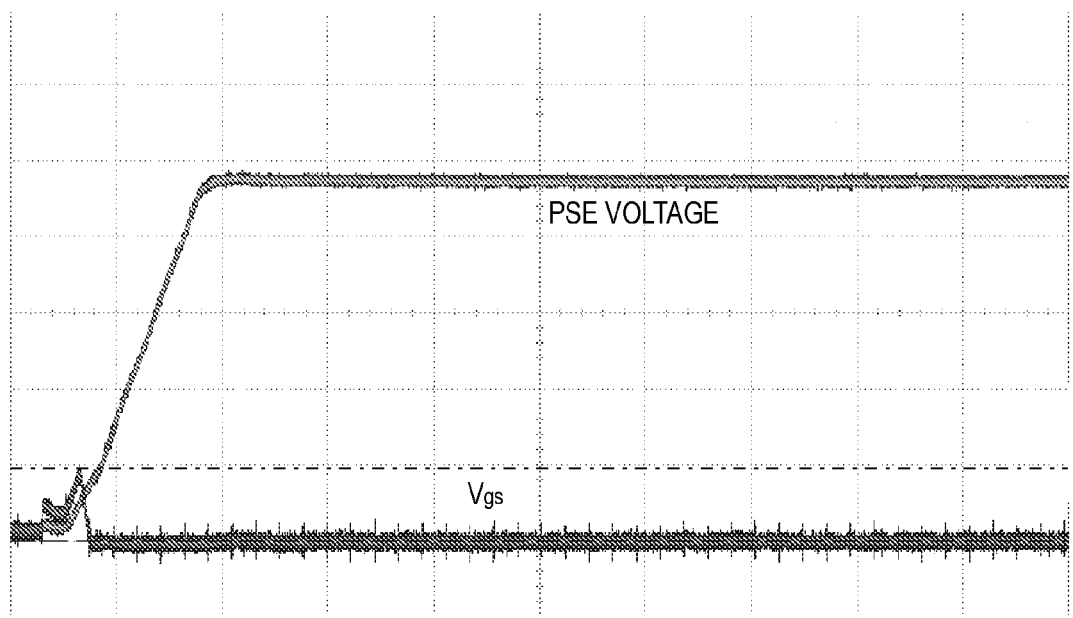
FIG. 6 illustrates a transient analysis of a short circuit module.

In the embodiment of FIG. 5, zener diode $D1=V_z+\_V$, where $\_V$ is the voltage tolerance of the zener diode. Here, $V2>V1>Vz+\_V$. During the Detection time or Classification time, although the input voltage (max 20V) may let the FET Q1 to turn on, D1 will not work. There would then be no impact on the remaining circuit. When the input voltage=V1>22V, both Q1 and D1 would work. The PSE can then measure the current $I_1$ passing through D1, Q1 and $R_{cable}$. When the input voltage=V2>V1, both Q1 and D1 keep working. The PSE can then measure the current $I_2$ passing through D1, Q1 and $R_{cable}$. According to the measured values of $I_1$ and $I_2$ and known voltages of V1 and V2, the PSE can calculate the cable resistance of $R_{cable}=\{[V2-(V_z+\_V)]-[V1-(V_z+\_V)]\}/(I_2-I_1)=(V2-V1)/(I_2-I_1)$. As this calculation illustrates, the two-point detection removes the impact of the zener diode. After finishing the measurement of cable resistance, the PSE can turn on power for the PD (e.g., apply 48V DC to power the PD). When this happens, then D2 turns on, Q2 turns on, and Q1 turns off, thereby isolating D1. More specifically, when the PSE starts to apply 48V DC to the PD, the voltage will ramp up from 0V to 48V. During this period, Q2 will be turned on due to the body capacitor of D2 to hold the voltage of $V_{gs}$ of Q1=0, which ensures that no current passes through D1 until the voltage passes 30V (i.e., D2 turns on). FIG. 6 illustrates the transient analysis of the SCM for the period of voltage ramping up on the PD side. As illustrated the voltage from the PSE is shown along with $V_{gs}$ of Q1.

Figure 7:
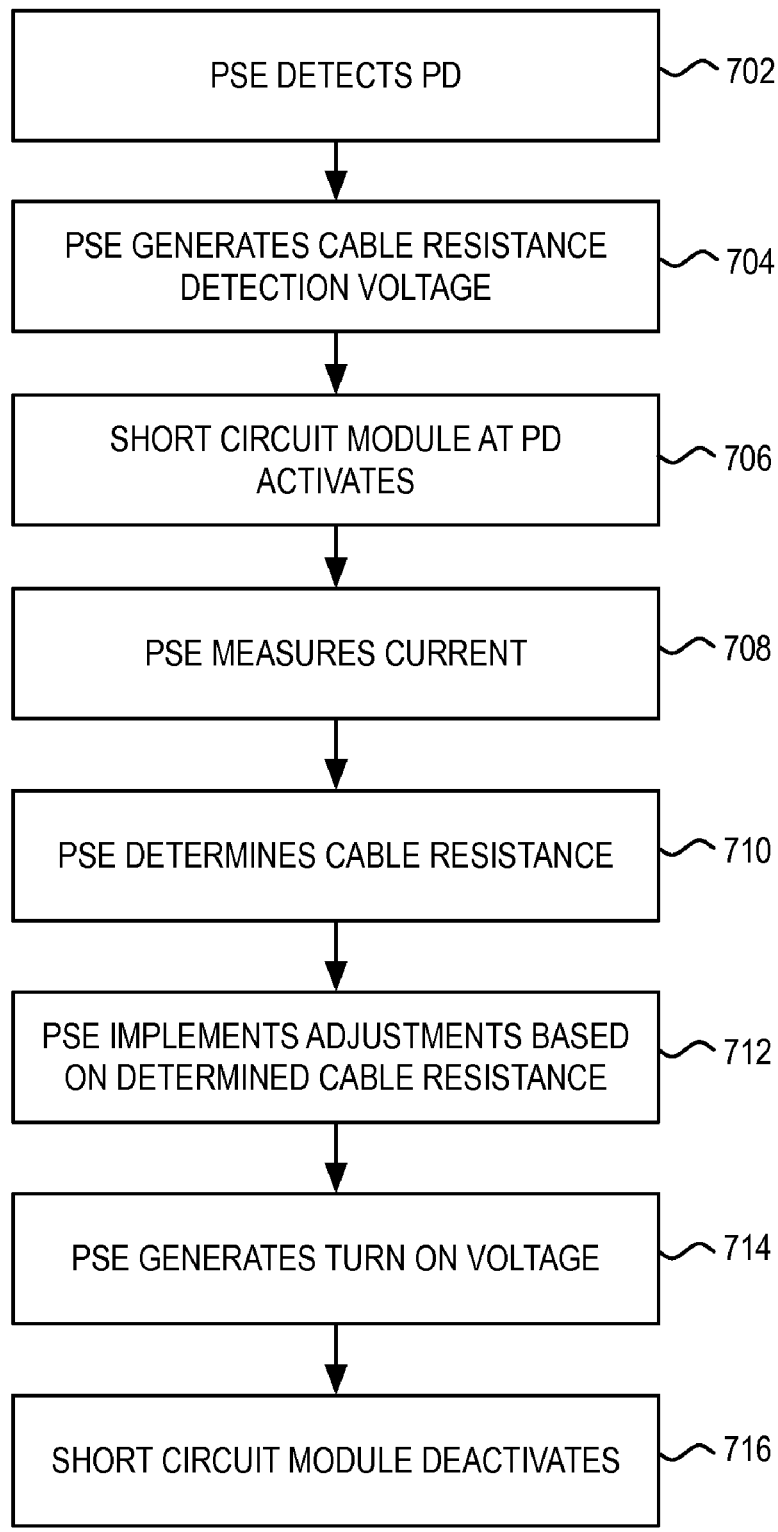
FIG. 7 illustrates a flowchart of a PoE process that incorporates cable resistance detection.

To further illustrate the principles of the present invention, reference is now made to the flowchart of FIG. 7, which illustrates a PoE process that includes cable resistance detection. As illustrated, the process begins at step 702 where the PSE detect the PD. This PD detection can occur during the Detection time illustrated in FIG. 4. Next, at step 704, the PSE generates a cable resistance detection voltage. Here, it should be noted that step 704 can be designed to follow the Detection time or the optional Classification time. In one embodiment, the cable resistance detection voltage has a value greater than a voltage used for detection and/or classification, but less than a voltage used for powering.

At step 706, the generation of the cable resistance detection voltage activates a short circuit module at the PD. At step 708, the PSE can then measure the current that flows through the circuit. The measurement of the current then enables the PSE to determine the cable resistance at step 710. As noted above, two different cable resistance detection voltages can be used to produce two different current measurements. These two current measurements can be used to cancel out the impact of additional elements in the circuit being measured. Where the uncertainty produced by those additional elements is not considered significant, a single current measurement can be used.

In one embodiment, the current measurement is performed by the PD. This current measurement can then be communicated by the PD to the PSE for use in calculating the cable resistance.

After the cable resistance is determined, the PSE can then determine an impact on the PoE system. For example, the cable resistance can change the power loss attributed to the cable, and hence the power budget needed for a given port. Regardless of the determined impact, the PSE can implement any needed adjustments to the PoE system operation or configuration at step 712. Significantly, these adjustments are based on an accurate measurement of the cable resistance instead of a resistance value produced through estimation or worst-case assumptions.

Once the adjustments have been implemented, the PSE can then continue in the ramp of the Turn On voltage at step 714. Once the Turn On voltage exceeds a certain threshold, the short circuit module would then deactivate at steps 716.

These and other aspects of the present invention will become apparent to those skilled in the art by a review of the preceding detailed description. Although a number of salient features of the present invention have been described above, the invention is capable of other embodiments and of being practiced and carried out in various ways that would be apparent to one of ordinary skill in the art after reading the disclosed invention, therefore the above description should not be considered to be exclusive of these other embodiments. Also, it is to be understood that the phraseology and terminology employed herein are for the purposes of description and should not be regarded as limiting.

What is claimed is:

1. A power over Ethernet method for measuring cable resistance, comprising:
   detecting, by a power sourcing equipment, a presence of a powered device;
   generating, by said power sourcing equipment, a cable resistance detection voltage, said cable resistance detection voltage being greater than a voltage used during detection or classification and less than a voltage when said powered device is being powered;
   activating, at said powered device, a short circuit module upon receipt of said cable resistance detection voltage, wherein activation of said short circuit module produces a short circuit effect at said powered device;
   measuring a current over said cable; and
   calculating a cable resistance using said current measurement.

2. The method of claim 1, further comprising generating a classification voltage for powered device classification prior to generating said cable resistance detection voltage.

3. The method of claim 1, further comprising generating a classification voltage for powered device classification after generating said cable resistance detection voltage.

4. The method of claim 1, wherein said measuring is performed by said power sourcing equipment.

5. The method of claim 1, wherein said measuring is performed by said powered device.

6. The method of claim 1, further comprising determining an impact on the power over Ethernet system using said calculated cable resistance.

7. The method of claim 1, further comprising generating a turn on voltage after said measuring.

8. The method of claim 1, further comprising deactivating said short circuit module when a turn on voltage approaches a level for powering of said powered device.

* * * * *